(12) United States Patent
Liu et al.

(10) Patent No.: US 10,724,135 B2
(45) Date of Patent: *Jul. 28, 2020

(54) ALCOHOL ASSISTED ALD FILM DEPOSITION

(71) Applicant: Applied Materials, Inc., Santa Clara, CA (US)

(72) Inventors: Feng Q. Liu, San Jose, CA (US); Mei Chang, Saratoga, CA (US); David Thompson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 20 days.

This patent is subject to a terminal disclaimer.

(21) Appl. No.: 15/909,352

(22) Filed: Mar. 1, 2018

(65) Prior Publication Data

US 2018/0187304 A1    Jul. 5, 2018

Related U.S. Application Data

(63) Continuation of application No. 14/920,001, filed on Oct. 22, 2015, now Pat. No. 9,914,995.

(60) Provisional application No. 62/082,944, filed on Nov. 21, 2014.

(51) Int. Cl.
| | |
|---|---|
| *C23C 16/455* | (2006.01) |
| *C23C 16/18* | (2006.01) |
| *C23C 16/02* | (2006.01) |
| *C23C 16/04* | (2006.01) |
| *H01L 21/768* | (2006.01) |
| *H01L 21/285* | (2006.01) |
| *C23C 16/458* | (2006.01) |

(52) U.S. Cl.
CPC .......... *C23C 16/18* (2013.01); *C23C 16/0281* (2013.01); *C23C 16/04* (2013.01); *C23C 16/45534* (2013.01); *C23C 16/45551* (2013.01); *C23C 16/45553* (2013.01); *H01L 21/28562* (2013.01); *H01L 21/76826* (2013.01); *H01L 21/76849* (2013.01); *H01L 21/76883* (2013.01); *C23C 16/4583* (2013.01)

(58) Field of Classification Search
CPC .................................................. C23C 16/04
See application file for complete search history.

(56) References Cited

U.S. PATENT DOCUMENTS

| | | |
|---|---|---|
| 5,186,718 A | 2/1993 | Tepman et al. |
| 6,482,740 B2 | 11/2002 | Soininen et al. |
| 6,566,276 B2 | 5/2003 | Maloney et al. |
| 6,759,081 B2 | 7/2004 | Huganen et al. |
| 7,250,083 B2 | 7/2007 | Sneh |
| 8,507,038 B2 | 8/2013 | Waechtler et al. |
| 2002/0013487 A1 | 1/2002 | Norman et al. |

(Continued)

OTHER PUBLICATIONS

Solanki, Raj, et al., "Atomic Layer Deposition of Copper Seed Layers", Electrochemical and Solid-State Letters, 3 (10), 2000, 479-480.

(Continued)

*Primary Examiner* — Joseph A Miller, Jr.
(74) *Attorney, Agent, or Firm* — Servilla Whitney LLC

(57) ABSTRACT

Methods of depositing a metal selectively onto a metal surface relative to a dielectric surface are described. Methods include reducing a metal oxide surface to a metal surface and protecting a dielectric surface to minimize deposition thereon and exposing the substrate to a metal precursor and an alcohol to deposit a film.

17 Claims, 2 Drawing Sheets

(56) References Cited

U.S. PATENT DOCUMENTS

| | | |
|---|---|---|
| 2003/0064153 A1 | 4/2003 | Solanki et al. |
| 2004/0058059 A1 | 3/2004 | Linford et al. |
| 2004/0092096 A1 | 5/2004 | Raaijmakers et al. |
| 2005/0084610 A1 | 4/2005 | Selitser |
| 2005/0181555 A1 | 5/2005 | Haukka et al. |
| 2006/0199399 A1 | 9/2006 | Muscat |
| 2007/0004204 A1 | 1/2007 | Fukazawa et al. |
| 2010/0301478 A1 | 12/2010 | Waechtler et al. |
| 2012/0070981 A1 | 3/2012 | Clendenning et al. |

OTHER PUBLICATIONS

PCT International Search Report and Written Opinion in PCT/US2015/056876 dated Dec. 23, 2015, 14 pages.

ALCOHOL ASSISTED ALD FILM DEPOSITION

CROSS-REFERENCE TO RELATED APPLICATIONS

This application is a continuation of U.S. patent application Ser. No. 14/920,001, filed Oct. 22, 2015, which claims priority to U.S. Provisional Application No. 62/082,944, filed Nov. 21, 2014, the entire disclosures of which are hereby incorporated herein by reference.

FIELD

Embodiments of the disclosure generally relate to methods of selectively depositing a film. More particularly, embodiments of the disclosure are directed to methods of selectively depositing a film using alcohol selective reduction and selective protection.

BACKGROUND

As the chip feature size goes below 10 nm, integration of copper interconnect is extremely challenging, especially in the aspects of copper barriers and copper seed deposition. It is known that conformal copper seed layer in gap fill is important to the integration of copper electroplating. However, current process copper seed layer deposited from PVD and CVD cannot meet the demanding requirements. Direct copper fill through PVD methods, even with high temperature processes, proves to be as difficult in certain interconnect geometries.

One difficulty of the integration process is that the copper seed layer should be a continuous film. For PVD copper seed process, films are often non-continuous and not conformal on the sidewall of the trench or via. Existing CVD copper films are not conformal and require a higher substrate temperature which leads to agglomeration of copper within trench or via.

Additionally, existing copper films have impurities resulting from the thermal degradation of the metal precursors. A typical copper film may have in the range of 2 to 10 atomic percent carbon and nitrogen.

Therefore, there is a need in the art for methods of depositing a metal film onto a metal surface selectively over a dielectric surface.

SUMMARY

One or more embodiments of the disclosure are directed to methods of depositing a film. The method comprises exposing a substrate to a first reactive gas comprising one or more of copper, cobalt, nickel or tungsten and a second reactive gas comprising an alcohol.

Additional embodiments of the disclosure are directed methods of depositing a film comprising providing a substrate having a first substrate surface including a metal oxide and a second substrate surface including a dielectric. The substrate is sequentially exposed to a first reactive gas comprising one or more of copper, cobalt, nickel or tungsten and a second reactive gas comprising an alcohol.

Further embodiments of the disclosure are directed to methods of depositing a film comprising providing a substrate having a first substrate surface including a metal oxide and a second substrate surface including a dielectric. The substrate is exposed to a pre-treatment comprising an alcohol in a first process region of a processing chamber to reduce the metal oxide to a first metal and form an alkoxy-terminated dielectric surface. The substrate is moved laterally from the first process region through a gas curtain to a second process region. The substrate is exposed to a first reactive gas in the second process region. The first reactive gas comprises one or more of copper, cobalt, nickel or tungsten. The substrate is laterally moved from the second process region through a gas curtain to a third process region. The substrate is exposed to a second reactive gas comprising a second alcohol in the third process region. The first alcohol and the second alcohol are each independently selected from the group consisting of methanol, ethanol, 1-propanol, isopropanol, 1-butanol, isobutanol, 1-pentanol, isopentanol, cyclopentanol, 1-hexanol, cyclohexanol, 1-heptanol, 1-octanol, 1-nonanol, 1-decanol, 1-undecanol, 1-dodecanol, 1-tetradecanol, 1-octadecanol, allyl alcohol (2-propen-1-ol), crotyl alcohol (cis or trans), methylvinylmethanol, benzyl alcohol, α-phenylethanol, 1,2-ethanediol, 1,3-propanediol, 2,2-dimethyl-1-propanol (neopentyl alcohol), 2-methyl-1-propanol, 3-methyl-1-butanol, 1,2-propanediol (propylene glycol), 2-butanol, β-phenylethanol, Diphenylmethanol and combinations thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
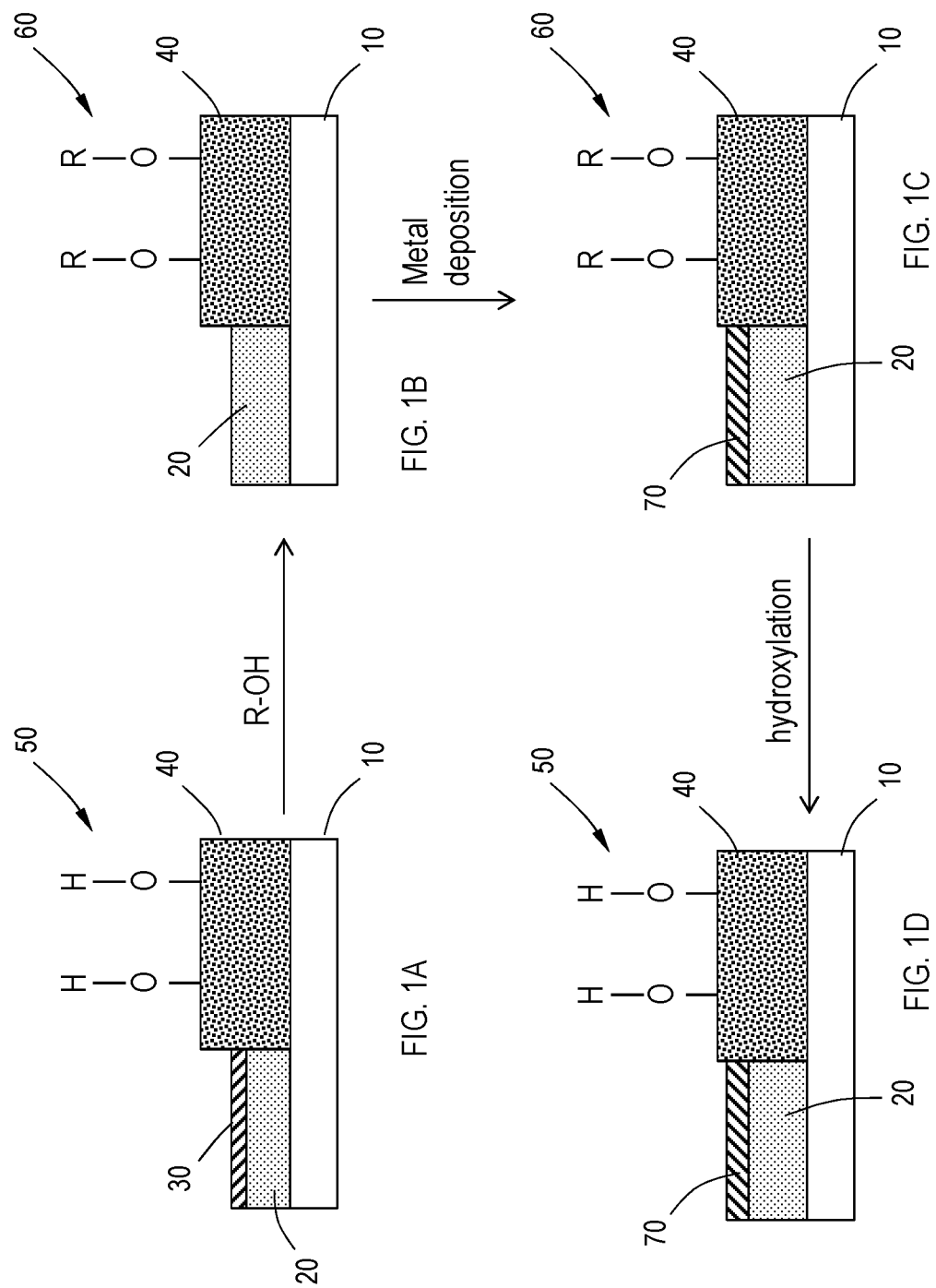
FIGS. 1A through 1D show a processing method in accordance with one or more embodiment of the disclosure.

Embodiments of the disclosure provide a method of depositing a film comprising one extra pre-treatment process prior to metal deposition. Embodiments of the disclosure use a single reagent or single process step for two purposes; reducing metal oxide (e.g., copper oxide) to metal (e.g., copper) and protecting the surface of the dielectric. The single process can be performed at one process temperature. Additionally, after the metal oxide reduction and dielectric surface protection with, for example, an alkoxy group, the metal precursor has substantially no reaction with the dielectric surface. This prevents or minimizes metal deposition on the dielectric surface and improves the selectivity of the metal deposition.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. In one or more embodiments, the first substrate surface will comprise a metal, and the second substrate surface will comprise a dielectric, or vice versa. In some embodiments, a substrate surface may comprise certain functionality (e.g., —OH, —NH, etc.).

Likewise, the films that can be used in the methods described herein are quite varied. In some embodiments, the films may comprise, or consist essentially of a metal. Examples of metal films include, but are not limited to, cobalt (Co), copper (Cu), nickel (Ni), tungsten (W), etc. In some embodiments, the film comprises a dielectric. Examples include, $SiO_2$, SiN, $HfO_2$, etc.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

One or more embodiments of the disclosure incorporate alcohol to function as a reducing agent to reduce a metal oxide (e.g., copper oxide) to metal (e.g., copper) and to function as a protecting agent to protect a dielectric surface by replacing the functional group (e.g., hydroxyl groups) with alkoxy groups. Some embodiments of the disclosure are vapor phase processes. In one or more embodiments, the process occurs at a single temperature.

After the metal oxide reduction and dielectric surface protection with alkoxy groups, a metal precursor (e.g., a cobalt precursor) has little or no reaction with the dielectric surface. With little or no reaction, the metal precursor is prevented from depositing on the dielectric surface. Therefore, one or more embodiments of the disclosure improve the selectivity of metal deposition.

In some embodiments, the process temperature is in the range of about 140° C. to about 300° C. The alcohol of some embodiments is a primary (e.g., ethanol, 1-propanol, 1-butanol, 1-pentanol, 1-hexanol, 3-methyl-1-butanol) and/or secondary alcohol (e.g., iso-propanol, 2-butanol, 2-pentanol, 3-pentanol, 2-hexanol, 3-hexanol, cyclopentanol, cyclohexanol). Suitable alcohols can reduce the metal oxide to metal at vapor phase at process temperature. Suitable alcohols may modify the dielectric surface to replace hydroxyl groups with alkoxy groups. In one or more embodiments, the Cu selective deposition on Co or Ru over dielectric is improved.

Accordingly, one or more embodiments of the disclosure are directed to methods of depositing a film. The deposited film can be a metal film or a metal-containing film. A metal-containing film can be a metal film or a mixed metal-non-metal film, for example, a metal oxide or metal nitride film, as the context implies.

Embodiments of the disclosure provide methods of selectively depositing a metal film onto one surface over a second surface. As used in this specification and the appended claims, the term "selectively depositing a film on one surface over another surface", and the like, means that a first amount of the film is deposited on the first surface and a second amount of film is deposited on the second surface, where the second amount of film is less than the first amount of film or none. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

With reference to FIGS. 1A-1D, a substrate 10 is provided or placed into a processing chamber. The substrate 10 has a first surface 20 which includes a metal oxide 30 and a second surface 40. For example, the first surface and the second surface may make up a semiconductor feature (e.g., a trench) in which the first surface forms a portion of the feature (e.g., bottom of the trench) and the second surface forms a separate part of the feature (e.g., sidewalls of the trench). As can be seen from the representation of the first surface 20 in FIG. 1A, the metal oxide 30 can be any oxide coating on the first surface 20. For example, the first surface can be copper with a thin layer of copper oxide on the surface. The metal oxide 30 layer can be formed by any suitable means, either intentionally, or as a side-result of another process. For example, the oxide layer may be formed as the result of exposure to air during movement of the substrate or can be intentionally formed by exposure to an oxidizing gas (e.g., oxygen or ozone) or another process, such as CMP process.

The metal oxide can be any suitable metal oxide. In some embodiments, the metal oxide 30 includes the metal of the first surface 20 so that upon reduction of the metal oxide, the bulk metal of the first surface remains. In some embodiments, the metal oxide of the first substrate surface comprises one or more of copper oxide, cobalt oxide, nickel oxide and ruthenium oxide.

The second surface 40 of some embodiments includes a dielectric material. In one or more embodiments, the second surface 40 comprises a dielectric material with a hydroxy-terminated surface 50. Hydroxy-terminated may also be referred to as "hydroxy-modified", and the like, to make a surface having hydroxyl groups.

The substrate 10 including the first surface 20, metal oxide 30 and second surface 40 with hydroxy-terminated surface 50 are exposed to an alcohol. As shown in FIG. 1B, the alcohol reduces the metal oxide 30 to the first surface 20 (e.g., the first metal). The reduction of the metal oxide to metal may also be referred to as reduction to a zero-valent metal. For example, copper oxide is reduced to copper.

Exposure to the alcohol also esterifies the hydroxyl-terminated surface 50 of the dielectric 40 to an alkoxy-terminated 60 second surface 40. As used in this specification and the appended claims, the term "alkoxy-terminated" means a surface with —OR groups. The term "alkoxy-terminated" and "alkoxy-modified" are used interchangeably. An alkoxy-terminated surface can have any R group depending on the alcohol used. The alkoxy group is not limited to alkanes and can be, for example, an alkane, alkene, alkyne, cycloalkane, cycloalkene, cycloalkyne, aryl (also called an aryloxy), or combinations thereof. For example, a silicon dioxide dielectric having hydroxyl terminations can be esterified with ethanol to a silicon dioxide dielectric with ethoxy terminations.

The dielectric of the second surface 40 can be any suitable dielectric. In some embodiments, the dielectric of the second surface 40 comprises a low-k dielectric. As used in this specification and the appended claims, the term low-k dielectric refers to a dielectric material having a dielectric constant less than or equal to about 5.

The alcohol can be any suitable alcohol depending on, for example, the first surface, the second surface, the deposition temperature and the final metal film being formed. The alcohol of some embodiments is one or more of a primary alcohol and a secondary alcohol.

In some embodiments, the alcohol is a primary alcohol. Suitable primary alcohols include, but are not limited to, methanol, ethanol, 1-propanol, isopropanol, 1-butanol, 1-pentanol, isopentanol, cyclopentanol, 1-hexanol, cyclohexanol, 1-heptanol, 1-octanol, 1-nonanol, 1-decanol, 1-undecanol, 1-dodecanol, 1-tetradecanol, 1-octadecanol, allyl alcohol (2-propen-1-ol), crotyl alcohol (cis or trans), methylvinylmethanol, benzyl alcohol, α-phenylethanol, 1,2-ethanediol, 1,3-propanediol, 2,2-dimethyl-1-propanol (neopentyl alcohol), 2-methyl-1-propanol, 3-methyl-1-butanol and 1,2-propanediol (propylene glycol). In one or more embodiments, the primary alcohol is selected from the group consisting of methanol, ethanol, 1-propanol, isopropanol, 1-butanol, 1-pentanol, isopentanol, cyclopentanol, 1-hexanol, cyclohexanol, 1-heptanol, 1-octanol, 1-nonanol, 1-decanol, 1-undecanol, 1-dodecanol, 1-tetradecanol, 1-octadecanol, allyl alcohol (2-propen-1-ol), crotyl alcohol (cis or trans), methylvinylmethanol, benzyl alcohol, α-phenylethanol, 1,2-ethanediol, 1,3-propanediol, 2,2-dimethyl-1-propanol (neopentyl alcohol), 2-methyl-1-propanol, 3-methyl-1-butanol, 1,2-propanediol (propylene glycol) and combinations thereof.

In some embodiments, the alcohol is a secondary alcohol. Suitable secondary alcohol include, but are not limited to, 2-butanol, β-phenylethanol, diphenylmethanol, and 1,2-propanediol (propylene glycol). Propylene glycol (1,2-propandiol) can act as both a primary and secondary alcohol. In one or more embodiments, the secondary alcohol is selected from the group consisting of 2-butanol, β-phenylethanol, diphenylmethanol, 1,2-propanediol (propylene glycol) and combinations thereof.

In some embodiments, the alcohol has the general formula

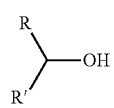

where R and R' are each independently selected from the group consisting of hydrogen, alkanes, alkenes, alkynes, cyclic alkanes, cyclic alkenes, cyclic alkynes and aromatics having in the range of 1 to 20 carbon atoms.

In some embodiments, the alcohol is a carboxylic acid. In this case, the compound used as the alcohol is not strictly an alcohol with the formula R—OH, but contains a hydroxyl in the form of R—COOH. In some embodiments, the alcohol is replaced with an aldehyde having the general formula RCOH as will be understood by those skilled in the art.

In some embodiments, the alcohol is a carboxylic acid having the general formula

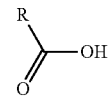

where R is selected from the group consisting of hydrogen, alkanes, alkenes, alkynes, cyclic alkanes, cyclic alkenes, cyclic alkynes and aromatics having in the range of 1 to 10 carbon atoms.

In some embodiments, the reducing agent is an aldehyde instead of an alcohol, the aldehyde having the general formula

where R is selected from the group consisting of hydrogen, alkanes, alkenes, alkynes, cyclic alkanes, cyclic alkenes, cyclic alkynes and aromatics having in the range of 1 to 20 carbon atoms.

The temperature at which the pre-treatment, i.e., the alcohol, carboxylic acid or aldehyde, is exposed to the substrate surfaces depends on, for example, the first surface, the second surface, the reducing agent being used (e.g., alcohol, carboxylic acid or aldehyde), the planned future processing, the past processing and the processing equipment being used. For example, a lower temperature process may help preserve the thermal budget of the substrate for further processing or the reducing agent being employed has a higher boiling point. In some embodiments, the substrate surface are exposed to the alcohol, or other reducing agent, at a temperature in the range of about 140° C. to about 300° C. In one or more embodiments, the substrate surfaces are exposed to the pre-treatment (e.g., alcohol, or other reducing agent), at a temperature in the range of about 180° to about 280° C. or in the range of about 190° to about 270° C. or in the range of about 200° to about 260° C. or in the range of about 210° to about 250° C. In some embodiments, the process temperature during pre-treatment is less than about 310° C., or less than about 300° C., or less than about 290° C., or less than about 280° C., or less than about 270° C., or less than about 260° C., or less than about 250° C., or less than about 240° C. In some embodiments, during pre-treatment the exposure to the reducing agent occurs in the vapor phase.

After exposure to the pre-treatment reducing agent (e.g., alcohol, aldehyde or carboxylic acid), the metal oxide film on the first surface has been reduced to the first metal and the second surface (e.g., dielectric) has been protected. This enables a metal film or metal-containing film to be deposited onto the first metal of the first surface selectively over deposition onto the second surface. The metal film can be deposited by any suitable method (e.g., atomic layer deposition, chemical vapor deposition).

Referring to the change from FIG. 1B. to FIG. 1C, after protecting the second surface 40 and preparing the first surface 20 (i.e., removing the oxide layer) the substrate surfaces can be exposed to one or more deposition gases to deposit a second metal 70, or second metal-containing film, onto the first surface 20. This deposition can occur selectively on surface 20 over the alkoxy-terminated 60 second surface 40, or the protected second surface 40.

Any suitable metal can be deposited as the second metal or metal-containing film. In some embodiments, the metal film comprises one or more of cobalt, copper, nickel, tungsten and ruthenium. For example, a cobalt film may be deposited over copper with substantially no deposition on a protected dielectric. As used in this specification and the appended claims, the term "substantially no deposition" used in this regard means that deposition thickness ratio of deposited layer 70 on surface 60 over surface 20, in a ratio in the range of 0-0.1, or 0-0.01.

In some embodiments, the first surface 20 comprises copper and the second metal 70 comprises cobalt. In one or more embodiments, the one or more deposition gases used to deposit the second metal 70 is one or more of cyclopentadienylcobalt dicarbonyl (CpCoCO), dicobalt hexacarbonyl tert-butylacetylene (CCTBA). bis(2,2,6,6-tetramethyl-3,5-heptaneketoiminate)cobalt, bis(dimethylamino-2-propoxy)copper, bis(dimethylamino-2-ethoxy)copper, bis(1-ethylmethylamino-2-butoxy)copper, bis(1-ethylmethylamino-2-propoxy)copper, bis(dimethylamino-2-propoxy)nickel and/or bis(2,2,6,6-tetramethyl-3,5-heptaneketoiminate)nickel.

In one or more embodiments, the first surface 20 comprises cobalt and the second metal 70 comprises copper. In some embodiments, the first surface 20 comprises nickel and the second metal 70 comprises one or more of copper and cobalt.

Once the second metal 70 has been deposited, further processing may be performed. For example, with reference to FIGS. 1C and 1D, hydroxylation of the alkoxy-terminated 60 second surface 40 may occur. This can be done by any suitable method or technique that can remove the alkoxy terminations from the alkoxy-terminated dielectric surface after depositing the second metal film such as water vapor.

Some embodiments of the disclosure are directed to metal deposition processes including CVD and ALD. In some embodiments, an ALD process has sequential metal precursor and alcohol pumping onto the substrate. This may allow the metal film to deposit conformally. The ALD process also makes the metal film thickness easily controllable. The use of alcohol in this ALD process is its reduction power toward metal (e.g., copper) precursors to lead clean copper films without contamination. The alcohol vapor is volatile, and its derivative product, aldehyde, is more volatile and leaves the metal (e.g., copper) film clean.

Some embodiments of the disclosure deposit copper films by simultaneously or sequentially exposing a substrate to a copper precursor and an alcohol. Suitable copper precursors include, but are not limited to bis(dimethylamino-2-propoxy) copper, bis(dimethylamino-2-ethoxy) copper, bis(methylamino-2-propoxy) copper, bis(amino-2-ethoxy)copper, bis(dimethylamino-2-methyl-2-propoxy) copper, bis(diethylamino-2-propoxy) copper, bis(2-methoxyethoxy) copper, bis(2,2,6,6-tetramethyl-3,5-heptanedionate) copper, bis(2,2,6,6-tetramethyl-3,5-heptaneketoiminate) copper, dimethylamino-2-propoxy copper (TMVS), 2,2,6,6-tetramethyl-3,5-heptanedionate copper (TMVS), and fluorine-containing precursors.

One or more embodiments of the disclosure are directed to integrated processes for integrated circuit (IC) beginning end of line (BEOL) interconnect. Some embodiments are used in junction with barrier films underneath, but not limited to, Ru, Mn, Co, Ta layers and their oxide and nitride compounds, as well as stacks of various layers.

Some embodiments of the disclosure are also useful with Cu seed used for integration processes with Cu electroplating. Embodiments of the disclosure include high throughput ALD Cu film deposition processes with deposition rate as high as in the range from 0.5 Å to 3 Å/cycle.

One or more embodiment of the disclosure is directed to methods of depositing a film. A substrate is exposed to one or more deposition gases including a first reactive gas comprising one or more of copper, cobalt, nickel or tungsten and a second reactive gas comprising an alcohol. The film formation process can occur with the same or different alcohol as the previous reductant used to prepare the surfaces for selective deposition. For example, a first alcohol may be exposed to the substrate to reduce a metal surface on the substrate to zero-valent metal and protect a dielectric followed by exposure to the first reactive gas and the second reactive gas in which the second reactive gas comprises a different alcohol than the first alcohol.

The film formation process can be CVD process in which the first reactive gas and the second reactive gas are exposed to the substrate surface at the same time so that the first reactive gas and the second reactive gas mix during formation of the film.

In some embodiments, the film formation process is an ALD process in which the substrate, or portion of the substrate, is sequentially exposed to the first reactive gas and the second reactive gas. Sequential exposure means that the substrate, or portion of the substrate, is exposed to only one of the first reactive gas and the second reactive gas at any given time. In ALD processes there is substantially no gas phase mixing of the first reactive gas and the second reactive gas.

The inventors have discovered that the formation of a metal or metal-containing film using alcohol as a reductant can be performed at lower temperatures. Typical processes not incorporating the alcohol reductant are performed at higher temperatures (e.g., up to about 650° C.). At these higher temperatures, the metal precursors employed can decompose so that excess carbon and nitrogen cannot be removed (easily) from the resulting film. For example, a metal deposition employing hydrogen as a reductant is generally performed at a temperature great than 200° C. (typically 250° C.). At this temperature, it is likely that the metal precursor will decompose. In some embodiments of the disclosure, there is substantially no gas phase decomposition of the first precursor. As used in this specification and the appended claims, the term "substantially no decomposition" means that there is less than 1% decomposition. In some embodiments, the substrate is maintained at a temperature in the range of about 100° C. to about 250° C., or in the range of about 100° C. to about 200° C., or less than about 250° C., 200° C., 175° C., 150° C. or 125° C.

In some embodiments, the substrate comprises a first substrate surface including a metal oxide and a second substrate surface including a dielectric. In one or more embodiments, the first surface comprises Co, Ru W or an oxide thereof. In some embodiments, the second surface comprises $SiO_2$. The substrate (both the first substrate surface and the second substrate surface) can be exposed to an alcohol to reduce the metal oxide to a first metal and form an alkoxy-terminated dielectric surface prior to exposure to the first reactive gas.

Figure 2:
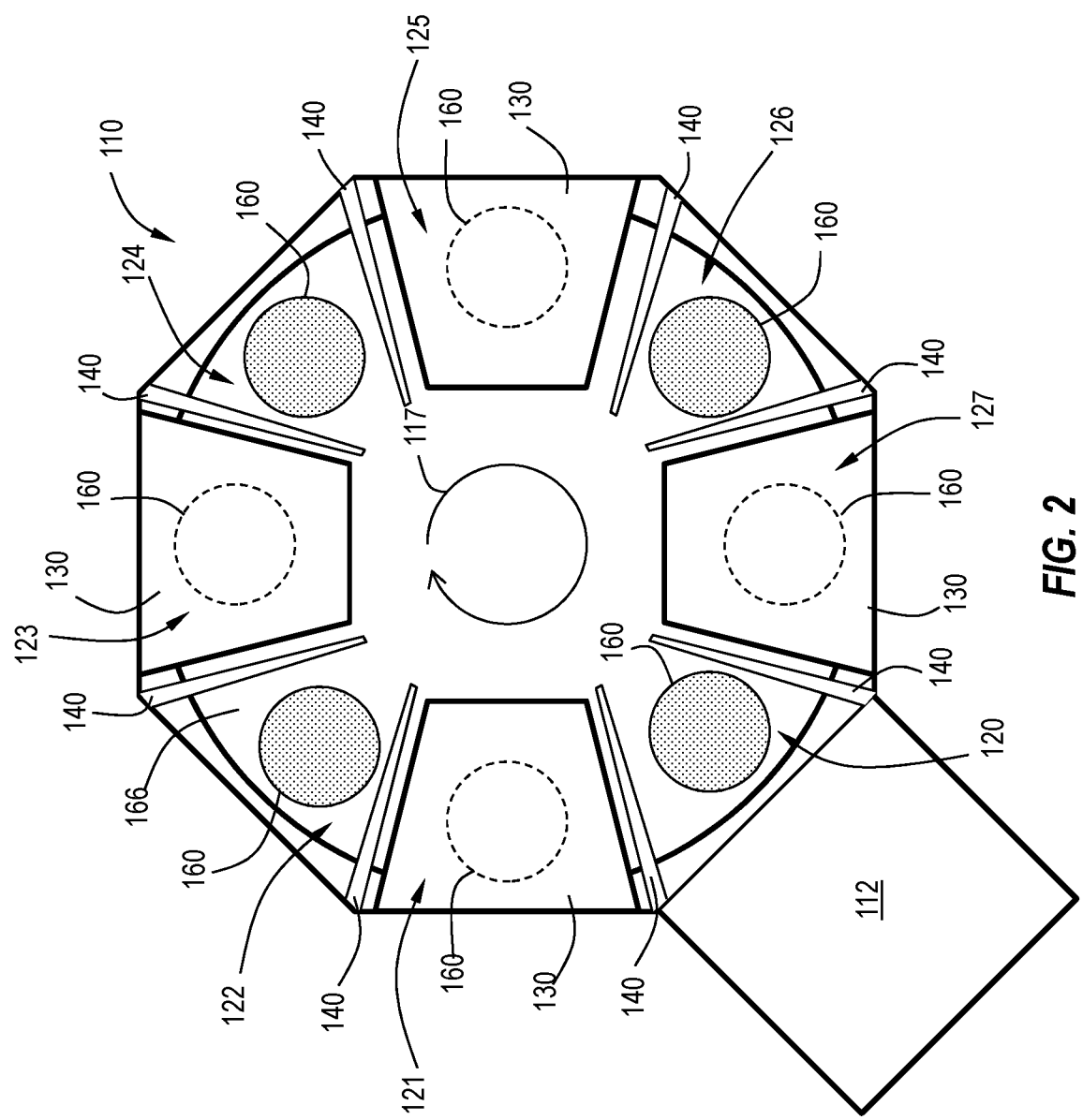
FIG. 2 shows an embodiment of a batch processing chamber in accordance with one or more embodiment of the disclosure.

FIG. 2 shows an embodiment of a spatial atomic layer deposition batch processor, referred to as a processing chamber 110. The shape of the processing chamber 110 and the components described are merely exemplary and should not be taken as limiting the scope of the disclosure. For example the octagonal shaped processing chamber can be circular or hexagonal, etc. A load lock 112 chamber is connected to a front (which may be arbitrarily designated as the front) of the processing chamber 110 and provides a way of isolating the interior of the processing chamber from the atmosphere outside of the processing chamber 110. Load lock 112 can be any suitable load lock, and can operate in the manner as any suitable load lock, as is known to those skilled in the art.

A substrate 160 passes into the processing chamber 110 into a loading region 120. In the loading region 120, the substrate 160 can be subjected to processing conditions or can rest. Processing conditions in the loading region can be, for example, pre-heating of the substrate 160 to process temperature, exposure to a pre-treatment (e.g., alcohol exposure) or cleaning. In some embodiments, the substrate 160 is exposed to a pre-treatment comprising a gaseous alcohol to reduce a metal oxide surface to a metal and alkoxylate a dielectric surface.

The substrate 160 is moved laterally from the loading region through a gas curtain 140 to a first process region 121. The use of ordinal numbers to describe the process regions is merely exemplary and should not be taken as limiting the scope of the disclosure. Use of the terms "first process region", "second process region", etc., are merely intended as a convenient way of describing different portions of the processing chamber. The specific location of the process regions within the chamber is not limited to the embodiment shown. Lateral movement of the substrate 160 can occur by rotation of a susceptor 166 about an axis indicated by arrow 117. In the first process region 121, the substrate 160 is exposed to the first reactive gas.

The substrate 160 is moved laterally within the processing chamber 110 from the first process region 121 through a gas curtain 140 to a second process region 122. The gas curtains 140 provide separation between the various process regions within the processing chamber 110. The gas curtains are shown as a wedge shaped component with a truncated inner end but it will be understood that the gas curtain can be any shape suitable for maintaining isolation of the process regions. The gas curtain 140 can include any suitable combination of inert gases and/or vacuum ports that are capable of separating the atmospheres of the individual process regions. In some embodiments, the gas curtains 140 comprise, in order, a vacuum port, an inert gas port and another vacuum port. At some point during movement of the substrate from the first process region 121 to the second process region 122, one portion of the substrate is exposed to the second process region while another portion of the substrate is exposed to the first process region 121 and a center portion is within the gas curtain 140.

In the second process region 122, the substrate 160 is exposed to the second reactive gas comprising an alcohol. When the loading region 120 includes an alcohol treatment, the alcohol used in the loading region 120 can be the same or different from the alcohol used in the second reactive gas. For example, the substrate may be exposed to methanol in the loading region 120 and ethanol in the second process region 122.

The substrate 160 can be continuously laterally moved along the circular path indicated by arrow 117 to expose the substrate to the third process region 123, fourth process region 124, fifth process region 125, sixth process region 126 and the seventh process region 127 and back to the loading region. In some embodiments, the loading region 120, second process region 122, fourth process region 124 and sixth process region 126 each expose the substrate to the second reactive gas comprising an alcohol and the first process region 121, third process region 123, fifth process region 125 and seventh process region 127 each expose the substrate 160 to the first reactive gas. The embodiment shown in FIG. 2 has a wedge shaped gas distribution assembly 130 positioned over the first, third, fifth and seventh process regions for clarity to show the substrate 160 on the susceptor 166 between gas distribution assemblies 130. However, it will be understood that any or all of the process regions can have a gas distribution assembly 130 or other gas delivery system.

EXAMPLES

A substrate having ruthenium and silicon dioxide was exposed to Cu(DMAP)$_2$ at 155° C. without alcohol exposure. The Cu(DMAP)$_2$ was pulsed for 500 cycles. No copper film was observed on the substrates at this temperature.

A substrate having ruthenium and silicon dioxide surface was exposed an ethanol pre-treatment followed by 500 cycles of Cu(DMAP)$_2$ and ethanol at 155° C. A copper film was deposited onto the surface at about 1.05 Å/cycle. The Cu film had low resistance about $2\times10^{-6}$ ohm cm.

In some embodiments, the process occurs in a batch processing chamber. For example, in a rotating platen chamber, one or more wafers are placed on a rotating holder ("platen"). As the platen rotates, the wafers move between various processing areas. For example, in ALD, the processing areas would expose the wafer to precursor and reactants. In addition, plasma exposure may be useful to properly treat the film or the surface for enhanced film growth, or to obtain desirable film properties.

Some embodiments of the disclosure process a substrate with the first surface and the second surface in a single processing chamber where in a first portion of the chamber, the substrate surfaces are exposed to the reducing agent (e.g., alcohol) to reduce the metal oxide and protect the second surface. The substrate is rotated to a second portion, or second and subsequent third portion or more, of the processing chamber to deposit the metal film on the first metal surface. In some embodiments, the substrate can be further rotated or moved to another portion of the processing chamber where the alkoxy-terminations of the second surface can be removed. To separate each or any of the portions, or regions, of the processing chamber, a gas curtain can be employed. The gas curtain provides one or more of purge gas and vacuum ports between the processing regions to prevent reactive gases from moving from one region to an adjacent region. In some embodiments, the substrate is exposed to more than one processing region at the same time, with one portion of the substrate in a first region (e.g., for alcohol exposure) and another portion of the substrate at the same time being in a separate region (e.g., metal deposition) of the processing chamber.

Embodiments of the disclosure can be used with either a linear processing system or a rotational processing system. In a linear processing system, the width of the area that the plasma exits the housing is substantially the same across the entire length of front face. In a rotational processing system, the housing may be generally "pie-shaped" or "wedge-shaped". In a wedge-shaped segment, the width of the area that the plasma exits the housing changes to conform to a pie shape. As used in this specification and the appended claims, the terms "pie-shaped" and "wedge-shaped" are used interchangeably to describe a body that is a generally circular sector. For example, a wedge-shaped segment may be a fraction of a circle or disc-shaped piece. The inner edge of the pie-shaped segment can come to a point or can be truncated to a flat edge or rounded. The path of the substrates can be perpendicular to the gas ports. In some embodiments, each of the gas injector assemblies comprise a plurality of elongate gas ports which extend in a direction substantially perpendicular to the path traversed by a substrate. As used in this specification and the appended claims, the term "substantially perpendicular" means that the general direction of movement of the substrates is along a plane approximately perpendicular (e.g., about 45° to 90°) to the axis of the gas ports. For a wedge-shaped gas port, the axis of the gas port can be considered to be a line defined as the mid-point of the width of the port extending along the length of the port.

Additional embodiments of the disclosure are directed to methods of processing a plurality of substrates. The plurality of substrates is loaded onto substrate support in a processing chamber. The substrate support is rotated to pass each of the plurality of substrates across a gas distribution assembly to expose the substrate surface to the reducing agent (e.g., alcohol), deposit a film on the substrate and, optionally, remove the protection layer from the reducing agent exposure. Any of the process steps, reducing agent exposure, metal deposition or hydroxylation can be repeated before moving to the next process, or sequentially.

Rotation of the carousel can be continuous or discontinuous. In continuous processing, the wafers are constantly rotating so that they are exposed to each of the injectors in turn. In discontinuous processing, the wafers can be moved to the injector region and stopped, and then to the region between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing between each layer deposition (e.g., exposure to plasma). The frequency of the plasma may be tuned depending on the specific reactive species being used. Suitable frequencies include, but are not limited to, 400 kHz, 2 MHz, 13.56 MHz, 27 MHz, 40 MHz, 60 MHz and 100 MHz.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. The details of one such staged-vacuum substrate processing apparatus are disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:

1. A method of depositing a film, the method comprising:
providing a substrate having a first substrate surface comprising a metal oxide and a second substrate surface comprising a dielectric having hydroxide terminations;
exposing the substrate to an alcohol to reduce the metal oxide to a first metal and form a protected dielectric surface;
depositing a metal film on the first metal selectively over the protected dielectric surface by exposing the substrate to a first reactive gas and a second reactive gas, the first reactive gas providing a metal atom selected from the group consisting of copper, cobalt, nickel and tungsten, the second reactive gas providing a reducing agent consisting essentially of a second alcohol to reduce the metal atom and form the metal film.

2. The method of claim 1, wherein the metal film is formed by exposing the substrate to the first reactive gas and the second reactive gas at the same time.

3. The method of claim 1, wherein the metal film is formed by sequential exposures of the first reactive gas and the second reactive gas so that the first reactive gas and the second reactive gas do not mix in the gas phase.

4. The method of claim 3, wherein the substrate is moved laterally within a processing chamber from a first process region comprising the first reactive gas, through a gas curtain, to a second process region comprising the second reactive gas.

5. The method of claim 4, wherein during lateral movement of the substrate, portions of the substrate are exposed to the first reactive gas, the gas curtain and the second reactive gas at the same time.

6. The method of claim 1, wherein the substrate is exposed to the first reactive gas and the second reactive gas at a temperature less than about 250° C.

7. The method of claim 6, wherein the temperature is less than about 150° C.

8. The method of claim 1, wherein the alcohol comprises one or more of a primary alcohol or a secondary alcohol.

9. The method of claim 8, wherein the alcohol is selected from the group consisting of methanol, ethanol, 1-propanol, isopropanol, 1-butanol, 1-pentanol, isopentanol, cyclopentanol, 1-hexanol, cyclohexanol, 1-heptanol, 1-octanol, 1-nonanol, 1-decanol, 1-undecanol, 1-dodecanol, 1-tetradecanol, 1-octadecanol, allyl alcohol (2-propen-1-ol), crotyl alcohol (cis or trans), methylvinylmethanol, benzyl alcohol, α-phenylethanol, 1,2-ethanediol, 1,3-propanediol, 2,2-dimethyl-1-propanol (neopentyl alcohol), 2-methyl-1-propanol, 3-methyl-1-butanol, 1,2-propanediol (propylene glycol), 2-butanol, β-phenylethanol, diphenylmethanol, and combinations thereof.

10. The method of claim 8, wherein the alcohol has the general formula

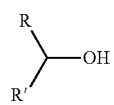

where R and R' are each independently selected from the group consisting of hydrogen, alkanes, alkenes, alkynes, cyclic alkanes, cyclic alkenes, cyclic alkynes and aromatics having in the range of 1 to 20 carbon atoms.

11. The method of claim 1, wherein the first reactive gas comprises one or more of cyclopentadienylcobalt dicarbonyl (CpCoCO), dicobalt hexacarbonyl tert-butylacetylene (CCTBA), bis(2,2,6,6-tetramethyl-3,5-heptaneketoiminate) cobalt, bis(dimethylamino-2-propoxy)copper, bis(dimethylamino-2-ethoxy)copper, bis(1-ethylmethylamino-2-butoxy) copper, bis(1-ethylmethylamino-2-propoxy)copper, bis(dimethylamino-2-propoxy)nickel, or bis(2,2,6,6-tetramethyl-3,5-heptaneketoiminate)nickel.

12. The method of claim 1, wherein the metal oxide comprises one or more of copper oxide, cobalt oxide, nickel oxide or ruthenium oxide.

13. A method of depositing a film, the method comprising:
providing a substrate having a metal oxide and a dielectric;
maintaining the substrate at a temperature less than or equal to about 150° C.;
reducing the metal oxide to a metal surface and alkoxylating the dielectric to form a protected dielectric surface by exposing the substrate to a first alcohol;
forming a metal film on the metal surface selectively over the protected dielectric surface by sequentially exposing the substrate to a first reactive gas and a second reactive gas, the first reactive gas comprising a metal precursor having a metal selected from the group consisting of copper, cobalt, nickel, tungsten and combinations thereof, and the second reactive gas comprising a reducing agent consisting essentially of an alcohol.

14. The method of claim 13, wherein the substrate is moved laterally within a processing chamber from a first process region comprising the first reactive gas, through a gas curtain, to a second process region comprising the second reactive gas, so that during lateral movement of the substrate, portions of the substrate are exposed to the first reactive gas, the gas curtain and the second reactive gas at the same time.

15. The method of claim 13, wherein the alcohol comprises one or more of a primary alcohol or a secondary alcohol.

16. The method of claim 13, wherein the alcohol is selected from the group consisting of methanol, ethanol, 1-propanol, isopropanol, 1-butanol, 1-pentanol, isopentanol, cyclopentanol, 1-hexanol, cyclohexanol, 1-heptanol, 1-octanol, 1-nonanol, 1-decanol, 1-undecanol, 1-dodecanol, 1-tetradecanol, 1-octadecanol, allyl alcohol (2-propen-1-ol), crotyl alcohol (cis or trans), methylvinylmethanol, benzyl alcohol, α-phenylethanol, 1,2-ethanediol, 1,3-propanediol, 2,2-dimethyl-1-propanol (neopentyl alcohol), 2-methyl-1-propanol, 3-methyl-1-butanol, 1,2-propanediol (propylene glycol), 2-butanol, β-phenylethanol, diphenylmethanol, and combinations thereof.

17. The method of claim 13, wherein the first reactive gas comprises one or more of cyclopentadienylcobalt dicarbonyl (CpCoCO), dicobalt hexacarbonyl tert-butylacetylene (CCTBA), bis(2,2,6,6-tetramethyl-3,5-heptaneketoiminate) cobalt, bis(dimethylamino-2-propoxy)copper, bis(dimethylamino-2-ethoxy)copper or bis(dimethylamino-2-propoxy) nickel, or bis(2,2,6,6-tetramethyl-3,5-heptaneketoiminate) nickel.

* * * * *